United States Patent [19]

Aronowitz et al.

[11] Patent Number: 5,043,292
[45] Date of Patent: Aug. 27, 1991

[54] SELF-ALIGNED MASKING FOR ULTRA-HIGH ENERGY IMPLANTS WITH APPLICATION TO LOCALIZED BURIED IMPLANTS AND INSOLATION STRUCTURES

[75] Inventors: Sheldon Aronowitz, San Jose; Courtney L. Hart, Los Gatos; Matthew Buynoski, Palo Alto, all of Calif.

[73] Assignee: National Semiconductor Corporation, Santa Clara, Calif.

[21] Appl. No.: 531,509

[22] Filed: May 31, 1990

[51] Int. Cl.⁵ .......................................... H01L 21/265
[52] U.S. Cl. ........................................ 437/26; 437/61; 437/67; 437/940
[58] Field of Search ....................... 437/20, 26, 61, 62, 437/DIG. 931, DIG. 940, DIG. 968, 67

[56] References Cited

U.S. PATENT DOCUMENTS

| 4,386,968 | 6/1978 | Hinkel et al. | 148/1.5 |
| 4,597,163 | 7/1986 | Tsang | 29/576 B |
| 4,655,875 | 4/1987 | Wada et al. | 156/643 |
| 4,697,333 | 10/1987 | Nakahara | 437/20 |
| 4,810,667 | 3/1989 | Zorinsky et al. | 437/62 |
| 4,992,390 | 2/1991 | Chang | 437/67 |

FOREIGN PATENT DOCUMENTS 0288462 12/1986 Japan .
0122227 6/1987 Japan .

*Primary Examiner*—Olik Chaudhuri
*Assistant Examiner*—M. Wilczewski
*Attorney, Agent, or Firm*—Limbach, Limbach & Sutton

[57] ABSTRACT

A self-aligned masking process for use with ultra-high energy implants (implant energies equal to or greater than 1 MeV) is provided. The process can be applied to an arbitrary range of implant energies. Consequently, high doses of dopant may be implanted to give high concentrations that are deeply buried. This can be coupled with the fact that amorphization of the substrate lattice is relatively localized to the region where the ultra-high energy implant has peaked to yield a procedure to form buried, localized isolation structures.

5 Claims, 5 Drawing Sheets

SELF-ALIGNED MASKING FOR ULTRA-HIGH ENERGY IMPLANTS WITH APPLICATION TO LOCALIZED BURIED IMPLANTS AND INSOLATION STRUCTURES

BACKGROUND OF THE INVENTION

1. Field of the Invention

The present invention relates to the fabrication of semiconductor integrated circuits and, in particular, to a self-aligned masking technique for use in ultra-high energy implants, i.e. implants of 1 MeV and greater. The technique has application to the formation of both localized buried implants and localized buried isolation structures.

2. Discussion of the Prior Art

The technology of integrated circuits is based upon controlling electric charge in the surface region of a semiconductor material. Typically, the semiconductor material is crystalline silicon. Control of electric charge in the crystalline silicon lattice is achieved by introducing impurity or "dopant" atoms into selected regions of the lattice.

The regions of the silicon lattice substrate to which dopant atoms are to be introduced are defined by transferring a corresponding pattern from a photographic "mask" to the substrate surface by a photolithographic, or "photomasking", process. In a typical sequence of steps in the photomasking process, a layer of silicon dioxide is first grown on the surface of the silicon substrate. A thin coating of photosensitive material, known as photoresist, is then formed on the oxide layer. The "negative" photoresist is then exposed to light through the mask. The portion of the photoresist not covered by opaque portions of the mask polymerize and harden as a result of this exposure (for a "positive" photoresist, the results would be the reverse). The unexposed portions are then washed away, leaving a photoresist pattern on the oxide surface that corresponds to the mask pattern. The portions of the silicon oxide that are not covered by the photoresist mask are then etched utilizing appropriate chemical procedures. The photoresist is then stripped, leaving an oxide layer that includes a desired pattern of "windows" through the oxide to the silicon surface. Dopant atoms are then introduced through the windows to the exposed silicon either by diffusion or by ion implantation.

Dopant diffusion is performed by placing the silicon substrate in a furnace through which flows an inert gas that contains the desired dopant atoms, causing the dopant atoms to diffuse into the exposed regions of the silicon surface.

In an ion implantation process, dopant atoms are introduced into the silicon by bombarding the exposed silicon regions with high-energy dopant ions. During the implantation process, the depth of penetration of the dopant ions into the silicon lattice is controlled by the ion implant energy, which is set by an accelerating field. The density of the implanted ions is controlled by the implant beam current. Typical commercial implant energy levels range from 30-200 kilo-electron-volts (KeV). Generally, a 1 micron layer of polysilicon, oxide or nitride is sufficient as a stopping material for these KeV implants.

When implanted dopant ions penetrate the silicon surface, they damage the lattice by producing defects and dislocations, in effect amorphizing the crystalline silicon structure. These localized amorphized regions are recrystallized by annealing the silicon at temperatures on the order of 500°-600° C. subsequent to the ion implantation step.

Recently, ultra-high energy implant machines that operate in the million-electron-volt (MeV) range have become commercially available. The ability to impart MeV range implant energies translates to the ability to create integrated circuit technologies that take advantage of the fact that dopant species can now be placed deeply into the silicon substrate at very high concentrations. However, full utilization of these ultra-high energy (i.e 1 MeV and greater) implants requires new techniques to create masks that can be used both as implant stoppers and to effectively pattern the silicon substrate target as desired.

The approach to masking MeV implants into silicon, for example, differs in kind from KeV implants. Differences arise due to the fact that relatively massive quantities of structurally firm material must be used to adequately stop the ultrahigh energy dopant ions from reaching the substrate other than in the desired regions defined by the mask. Moreover, materials used for ultra-high energy masking should possess qualities that permit differential etching for creation of special purpose implant structures.

SUMMARY OF THE INVENTION

The present invention provides a self-aligned masking technique for ultra-high energy implants with application to localized buried implants and localized buried isolation structures.

In a general masking procedure in accordance with the present invention, a sequence of alternating polysilicon and thin silicide layers is used to mask dopants over a wide range of MeV implant energies. The polysilicon and silicide layered structure terminates with a final polysilicon layer that is separated from the underlying silicon substrate by a layer of silicon oxide. The oxide layer is present, in part, to block secondary implantation from the masking materials due to interaction with the ultra-high energy dopant species.

The ability to place dopant deep within a suitable semiconductor substrate can be exploited to form localized buried regions. Thus, the generalized masking process of the present invention, coupled with the ultra-high energy implants, can be used to create new types of integrated circuit structures based on localized buried implants and localized buried isolation structures.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Simulation of ultra-high energy ion implantation (i.e. ion implantation in the million-electron-volt (MeV) and greater range) through various stopping materials was used to explore appropriate implant stopping thicknesses. One set of simulations employed the Boltzmann transport model in SUPREM-3, while a second set used a three-dimensional Monte Carlo implant program, MARLOWE. Both SUPREM-3 and MARLOWE are well-known simulation programs. The results of these simulations showed that approximately 2 microns of tungsten is needed to effectively shield a $10^{16}/cm^2$ dose of silicon or phosphorous implanted at 2 MeV; a 25% increase in layer thickness to 2.5 microns permits polysilicon to be used.

We have also found that a polysilicon layer having a thickness of about 1.0–1.25 microns per 1 Mev increment in implant energy is sufficient as a blocking layer for a silicon implant. Thus for a dopant species D having atomic weight $W_D$, a polysilicon layer have the following thickness per 1 MeV increment in implant energy shold be sufficient as a block layer for the D dopant implant:

$$(1.0 - 1.25) \times \sqrt{W_S/W_D} \text{ microns}$$

where $W_S$ is the atomic weight of silicon.

Figure 1A:
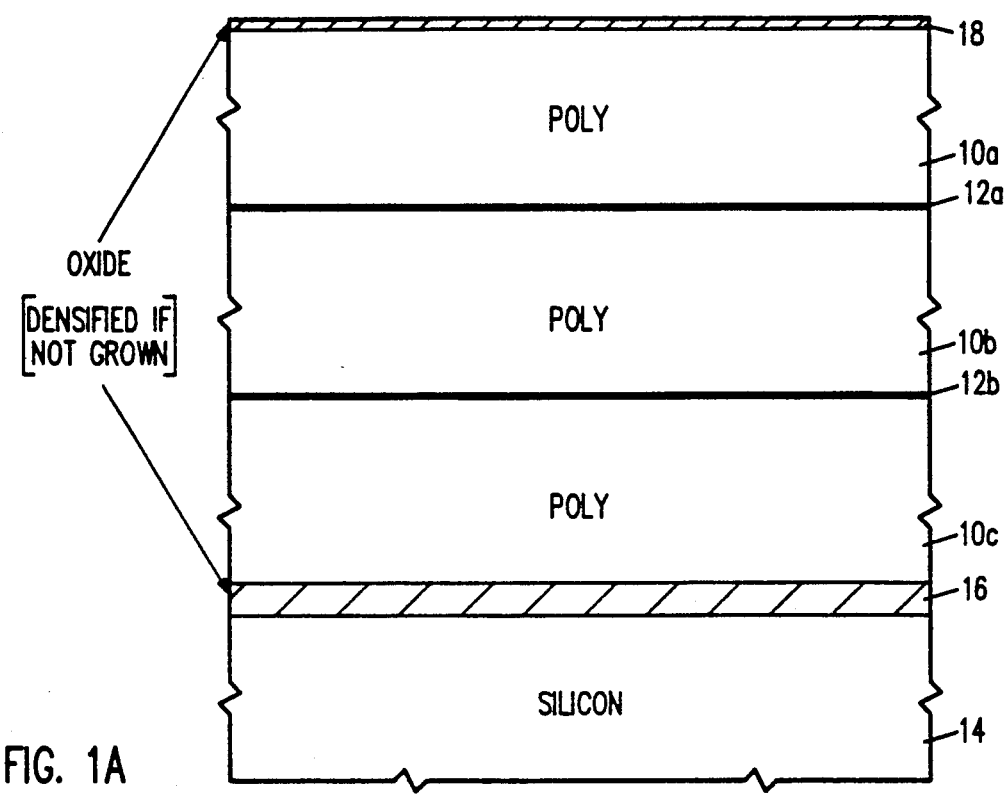
FIGS. 1A-1E illustrate a general self-aligned masking procedure for use in ultra-high energy implants in accordance with the present invention.

As shown in FIG. 1A, a combination of alternating 2.0–2.5 micron polysilicon layers (10a,10b,10c) and thin titanium or tungsten silicide layers (12a,12b) can be used to mask dopants over a wide range of MeV implant energies. This layered approach is utilized to reduce strain problems that can occur if the thickness of a single polysilicon layer exceeds 2.5 microns and to provide a conductive silicide layer at convenient depths in the device structure.

The polysilicon/silicide layering terminates with the bottom polysilicon layer 10c being separated from the substrate 14 by a silicon dioxide layer 16 greater than about 0.1 microns thick, preferably about 0.5 microns thick. The oxide layer 16 is present, in part, to block secondary implantation from the overlying masking materials due to interaction with the ultra-high energy dopant species and to provide a plasma etch stopper during patterning of the adjacent polysilicon layer, as described below.

A detailed process suitable for masking 6 MEV silicon or phosphorous implants is illustrated schematically in FIGS. 1A-1E. The illustrated masking process begins with formation of the FIG. 1A structure described above. Consistent with our finding that a polysilicon thickness of about 1.0–1.25 microns is required for each 1 MeV increment in implant energy, the FIG. 1A structure utilizes three layers of polysilicon (10a,10b,10c), each about 2.0–2.5 microns thick, separated by silicide (tungsten or titanium) layers (12a,12b) about 0.05–0.3 microns, preferably about 0.2 microns, thick.

Figure 1B:
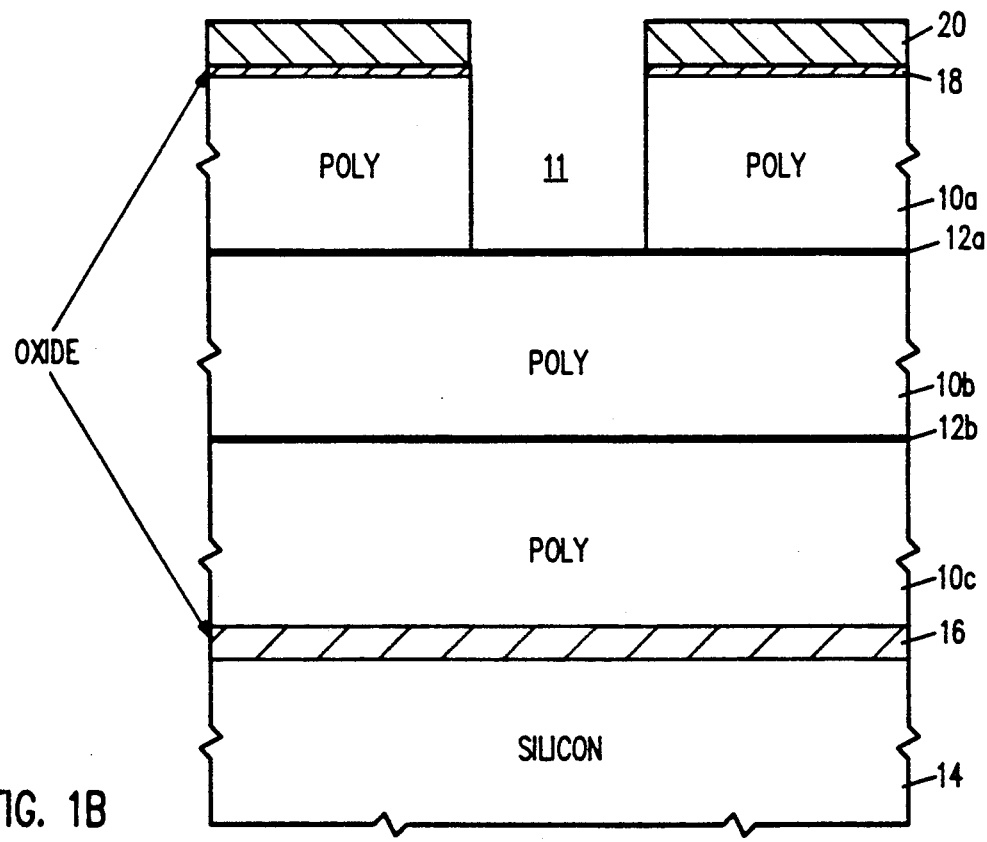

Referring to FIG. 1B, the initial stage of a trench 11 for providing the window to the silicon substrate 14 is formed by first forming an oxide layer 18 on the upper polysilicon layer 10c. A photoresist layer 20 is then deposited on the upper oxide layer 18. The photoresist 20 is then patterned and etched to expose the oxide 18, which is then etched using hydrofluoric acid to expose the underlying polysilicon layer 10a. The exposed polysilicon 10a is then plasma etched to the underlying silicide layer 12a.

Figure 1C:
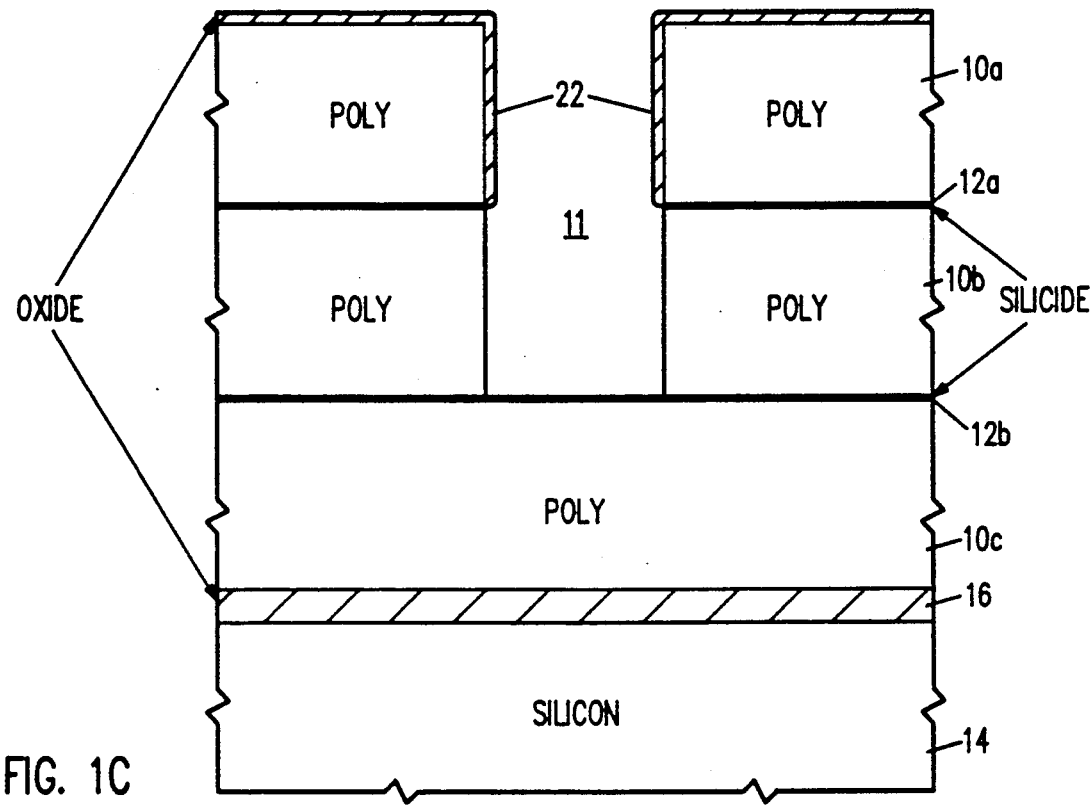

Next, as shown in FIG. 1C, the overlying photoresist 20 is stripped and an oxidation step is performed to grow oxide 22 along the exposed polysilicon walls of the trench 11. A selectively etched oxide is then formed on the exposed silicide layer 12a and the oxidized silicide is selectively etched to expose the intermediate polysilicon layer 10b. The intermediate layer 10b of polysilicon is then plasma etched to expose the lower silicide layer 12b.

Figure 1D:
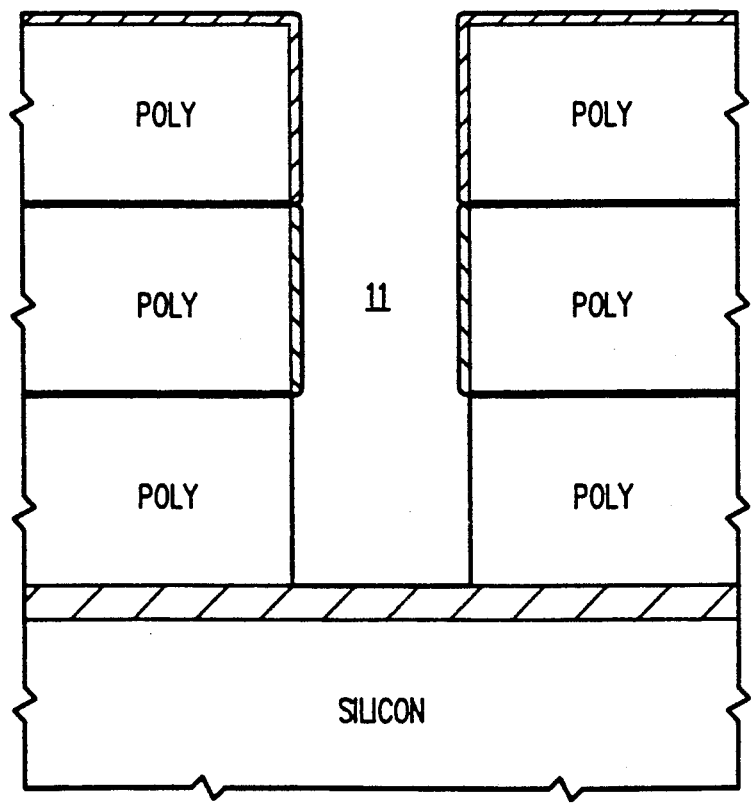

Referring to FIG. 1D, an oxidation step is then performed to extend the oxide 22a along the walls of the trench 11 on the sidewalls of the intermediate polysilicon layer 10b. A selectively etched oxide is then formed from the silicide 10b and the lower layer 12b of silicide is selectively etched. The lower polysilicon layer 10c is then plasma etched to the oxide layer 16.

Figure 1E:
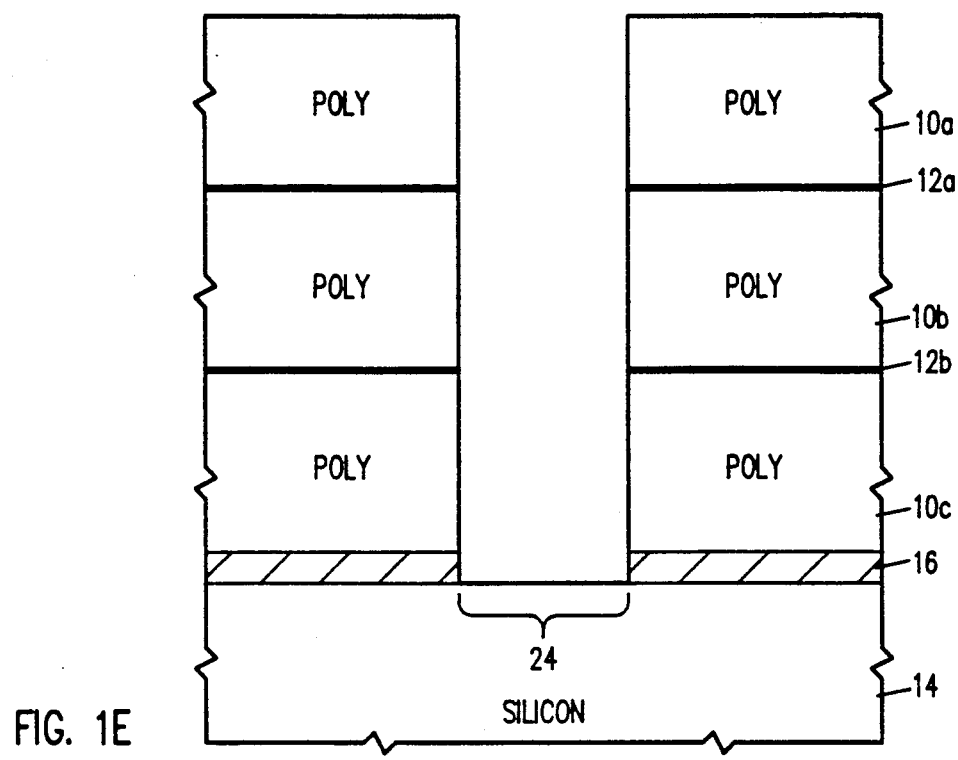

Finally, as shown in FIG. 1E, the oxide, including both oxide layer 16 and the sidewall oxide in the trench 11, is stripped using hydrofluoric acid to expose a desired region 24 of the underlying FIGS. 2A-2D illustrate an application of the above-described general ultra-high energy self-aligned masking procedure to create localized deeply buried dopant regions.

Figure 2A:
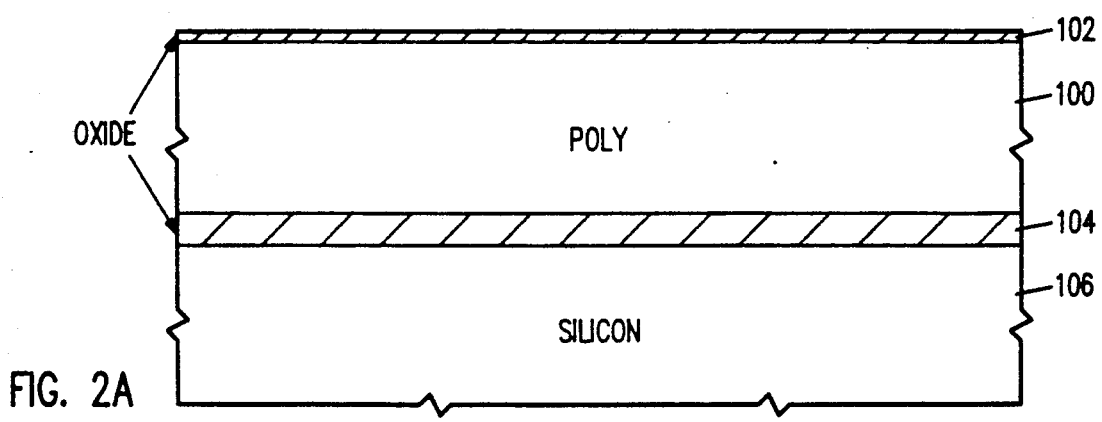
FIGS. 2A-2D illustrate application of the ultra-high energy self-aligned masking procedure to create localized deeply buried dopant regions.

FIG. 2A shows a 2.0–2.5 micron polysilicon stopping layer 100 sandwiched between an overlying layer of thin oxide approximately 0.05 to 0.2 microns thick and a 0.2 to 0.5 micron oxide layer 104 formed on silicon substrate 106; the FIG. 2A structure is consistent with the polysilicon/oxide/substrate structure described above with respect to FIGS. 1A-1E.

In the example to be described, the objective is to form a relatively deep, localized, buried (approximately 2 micron) high density n-type region utilizing a 2 MeV phosphorous implant. As described above, a Monte Carlo simulation has indicated that the 2.0–2.5 micron polysilicon layer 100 is sufficient to act as a stopper for a phosphorous implant at this energy.

Figure 2B:
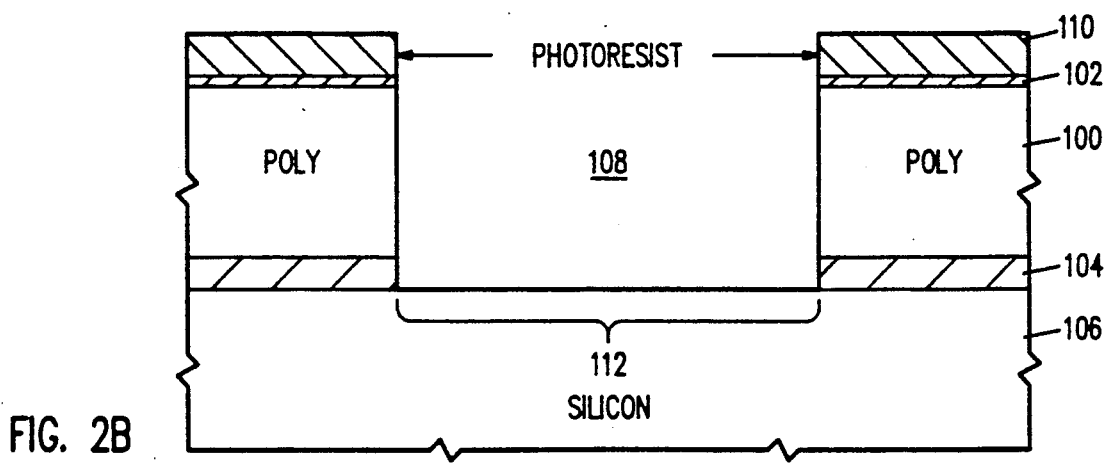

Referring to FIG. 2B, the first step in the process is to create an implant trench 108 in accordance with the generalized procedure described above. That is, a layer of photoresist 110 is first deposited on the upper oxide layer 102. The photoresist 110 is patterned to expose the underlying oxide 102 which is, in turn, etched with hydrofluoric acid to expose the underlying polysilicon 100. The polysilicon 100 is then plasma etched to the lower oxide layer 104. The oxide 104 is then etched to complete the trench 108 and expose a region 112 of the underlying silicon substrate 106.

Figure 2C:
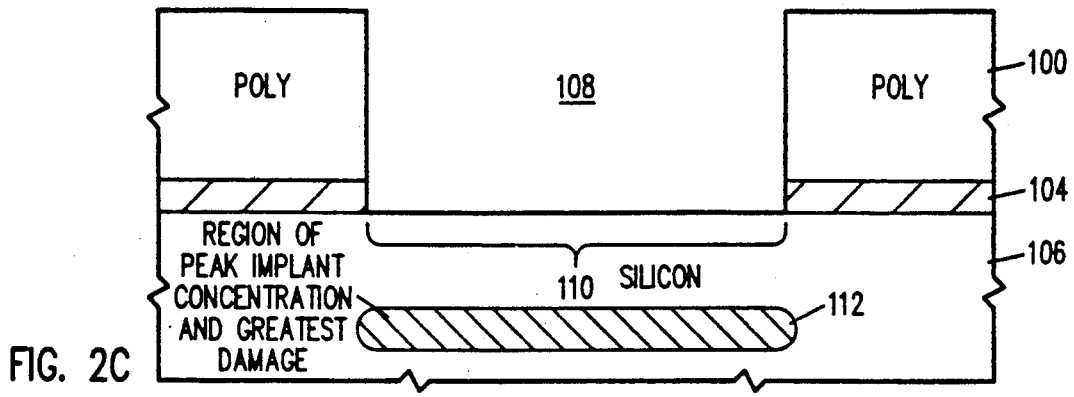

Next, referring to FIG. 2C, the photoresist 110 is stripped and the upper oxide 102 is removed in an HF dip. Phosphorous is then implanted into the exposed region 100 of the substrate 106 at a dose greater than $10^{13}/cm^2$ and at an implant energy of about 2 MeV. This results in the formation of a buried region 112 with its peak implant concentration approximately 2 microns deep. The peak implant concentration region 112 is also the region of the greatest lattice damage.

Figure 2D:
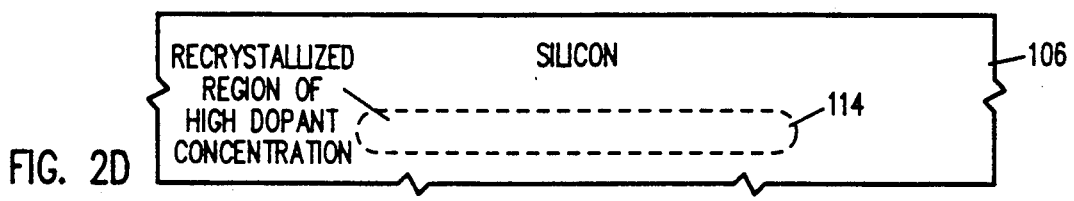

Referring to FIG. 2D, the final step in the process is to recrystallize the damaged lattice region 112 to provide the desired n-type buried region in the silicon substrate 106. This is accomplished by first depositing resist over the entire exposed surface region 112 to protect the underlying silicon substrate 106. The resist is then patterned to expose the polysilicon 100, which is removed in a plasma etching step. Next, the resist is stripped from the region 112 and the oxide 104 is removed in an HF dip. Finally, the structure is exposed to a high temperature RTA or furnace anneal at 900° C. to effect the recrystallization of the damaged lattice region 112 to form the n-type buried region 114.

In accordance with another aspect of the present invention, the generalized process described above with respect to FIGS. 1A-1E can be used to form buried isolation structures.

It has been shown experimentally that extensive damage or complete amorphization takes place in the silicon lattice region where an ion implant peaks. However, this lattice damage is not distributed throughout the pathway of the energetic dopant. Thus, high energy MeV implants can be used to amorphize buried regions in silicon. If silicon is used as the amorphizing agent, then the substrate will not ultimately be altered. However, when silicon is used as the amorphizing agent, oxidation is enhanced only by a factor of 2, approximately, with respect to crystalline silicon. Using an n-type dopant species enhances the relative oxidation rate considerably.

One embodiment of the envisioned procedure is schematically illustrated in FIGS. 3A-3D.

Figure 3A:
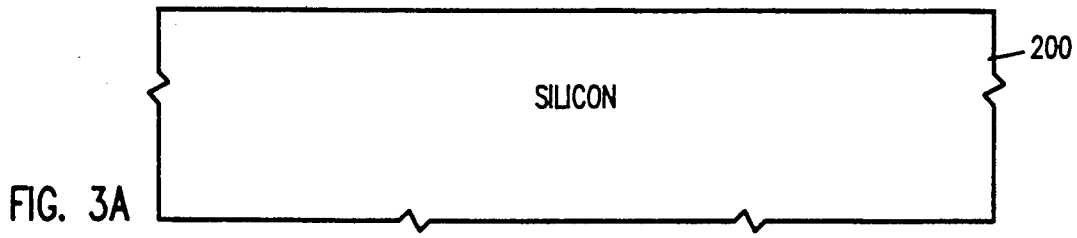
FIGS. 3A-3D illustrate application of ultra-high energy implants to create buried, localized isolation structures in accordance with the present invention.

FIG. 3A shows a crystalline silicon substrate 200.

Figure 3B:
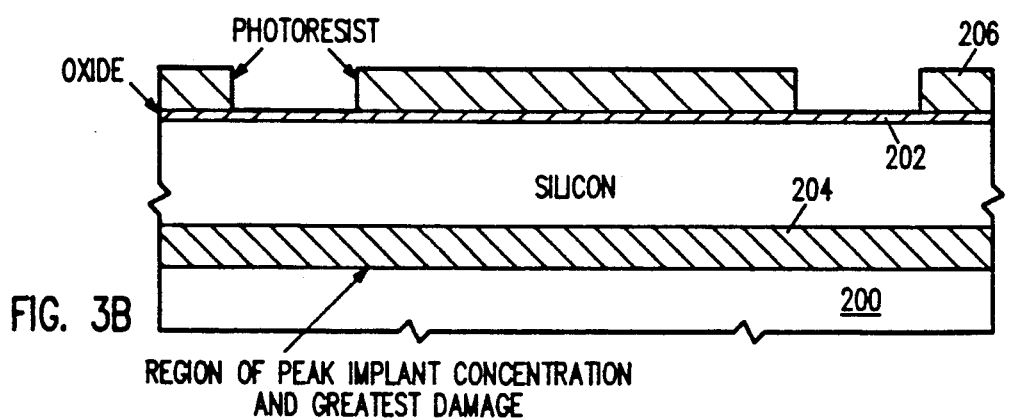

As shown in FIG. 3B, the first step in the construction of localized buried isolation structures is to deposit or grow a pad oxide layer 202 on the entire surface of the silicon substrate 200. Next, a 2 MeV implant of silicon or phosphorous is performed at a dose greater than $5 \times 101^{15}/cm^2$. This creates a region 204 of peak implant concentration and greatest lattice damage about 2 microns below the silicon surface. Next, a layer of resist 206 is deposited and patterned to exposed desired regions of the pad oxide 202.

Figure 3C:
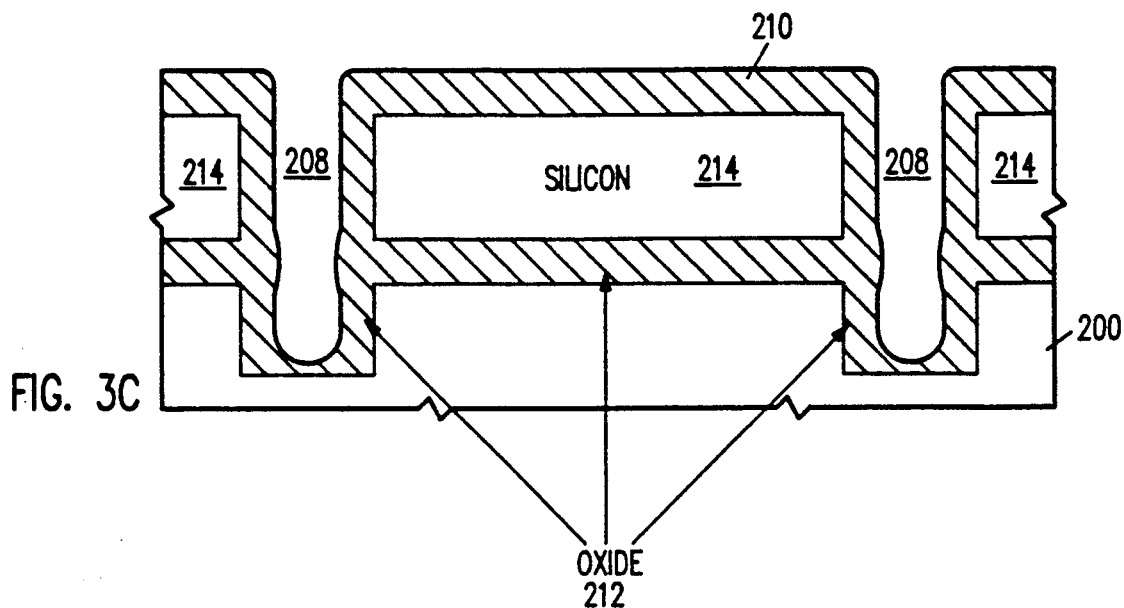

Next, referring to FIG. 3C, the structure is plasma etched to form trenches 208 to a depth below the region 204 of peak implant concentration. Next, the resist 206 is removed and a high pressure oxidation step is performed to form an oxide coating 210 on all exposed silicon areas and to convert the amorphized silicon regions 204 to isolation oxide 212. This results in isolated silicon regions 214 being formed in selected regions of the substrate 200. A high pressure oxidation is utilized to provide rapid distribution of oxygen to the amorphized regions of the lattice to increase the oxidation rate, since the natural tendency of the amorphized regions is toward recrystallization.

Figure 3D:
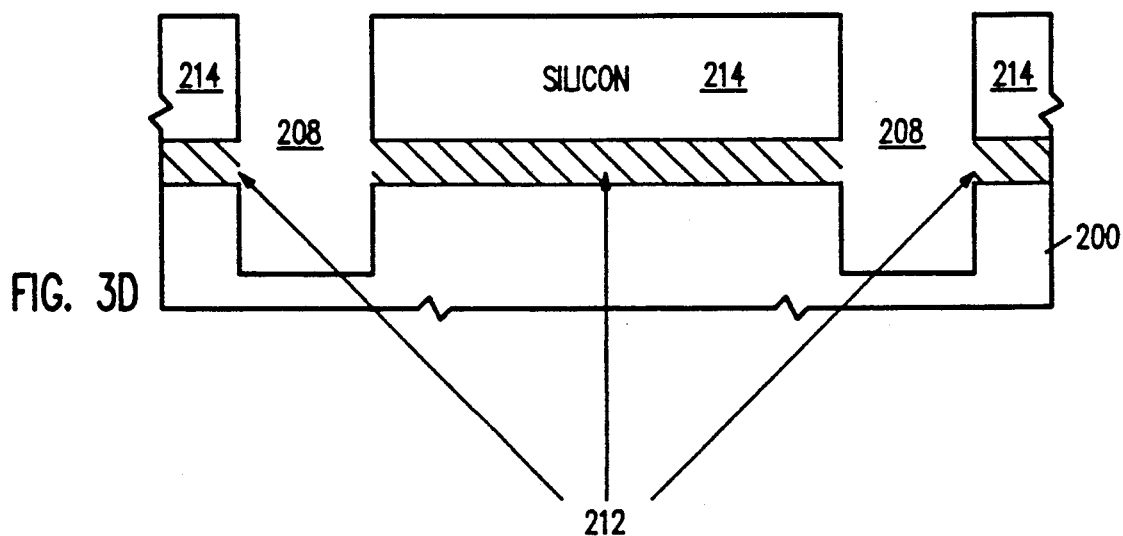

As shown in FIG. 3D, a selective oxide etch produces the finalized localized buried isolation structures.

In forming the isolation structures, the trenches 208 are suitably distributed to permit introduction of high pressure oxidation processes. The trenches 208 also offer an avenue for the relaxation of strain resulting from the oxidation of the buried amorphous layer.

The FIG. 3A-3D example is directed to the formation of an amorphized region 204 (FIG. 3B) underlying the entire surface of the silicon substrate 200, i.e. wafer-wide. Those skilled in the art will appreciate that the masking procedure described above with respect to FIGS. 1A-1E can be utilized to create more localized isolation structures, as desired.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A method of forming a masking structure for blocking implantation of dopant atoms into a silicon substrate at implant energies equal to or greater than 1 MeV, the method comprising:
    (a) forming a silicon dioxide layer on the silicon substrate;
    (b) forming a first layer of polysilicon on the silicon dioxide layer;
    (c) forming a metal silicide layer on the first layer of polysilicon;
    (d) forming one or more additional layers of polysilicon overlying the metal silicide layer, each of the one or more additional layers of polysilicon being separated from an overlying adjacent layer of polysilicon by a layer of metal silicide formed therebetween,
    the total thickness of all polysilicon layers being greater than about the following thickness for each 1 MeV increment in implant energy $$(1.0 - 1.25) \times \sqrt{W_S/W_D} \text{ microns}$$

where $W_S$ is the atomic weight of silicon and $W_D$ is the atomic weight of the dopant atoms; and
    (e) forming a trench through each of the layers recited in steps (a)-(d) to expose a surface region of the silicon substrate.

2. A method of forming a masking structure for blocking implantation of silicon atoms into a silicon substrate at implant energies equal to or greater than 1MeV, the method comprising:
    (a) forming a silicon dioxide layer approximately 0.5 microns thick on the silicon substrate;
    (b) forming a first polysilicon layer approximately 2.0-2.5 microns thick on the silicon dioxide layer;
    (c) forming at least one additional polysilicon layer 2.0-2.5 microns thick overlying the first polysilicon layer for each incremental increase in implant energy beyond 2MeV, each additional polysilicon layer being separated from the overlying polysilicon layer by a layer of metal silicide;
    (d) forming a trench through each of the layers recited in elements (a)-(c) to expose a surface region of the silicon substrate; and
    (e) implanting silicon atoms into the surface region at an implant energy equal to or greater than 2 MeV.

3. A method of forming a localized buried isolation structure in a silicon substrate, the method comprising:
    (a) forming a layer of dielectric material on the silicon substrate;
    (b) ion implanting dopant atoms into the silicon substrate at an implant energy equal to or greater than 2 MeV to define a buried amorphized region with its peak implant concentration below the surface of the silicon substrate;
    (c) forming a plurality of trenches in the silicon substrate to a depth below that of the depth of the amorphized buried region; and
    (d) oxidizing the buried region to convert the amorphized buried region to a buried oxide isolation structure.

4. A method of forming a localized buried isolation structure in a silicon substrate by implanting dopant atoms, the method comprising:
 (a) forming a layer of dielectric material on the silicon substrate;
 (b) forming polysilicon overlying the layer of dielectric material, the thickness of the polysilicon being greater than about the following thickness for each 1 MeV incremental increase in implant energy $$(1.0 - 1.25) \times \sqrt{W_S/W_D} \text{ microns}$$

where $W_S$ is the atomic weight of silicon and $W_D$ is the atomic weight of the dopant atoms; and
 (c) forming a plurality of trenches through each of the layers recited in steps (a) and (b) to expose a plurality of surface regions of the silicon substrate;
 (d) forming a layer of dielectric material on the exposed surface regions of the silicon substrate;
 (e) implanting dopant atoms into the exposed surface regions of the silicon substrate at an implant energy equal to or greater than 2 MeV to define a plurality of buried amorphized regions below the surface of the silicon substrate;
 (f) forming trenches in the silicon substrate to a depth below the depth of the amorphized buried regions such that at least two trenches intersect each of the amorphized buried regions; and
 (g) oxidizing the amorphized buried regions to convert the amorphized buried regions to localized buried oxide isolation structures 5. A method of forming a masking structure for blocking implantation of dopant atoms into a silicon substrate at implant energies equal to or greater than 1 MeV, the method comprising:
 (a) forming a layer of dielectric material on the silicon substrate;
 (b) forming a composite conductive layer overlying the layer of dielectric material by forming a first layer of polysilicon on the layer of dielectric material and forming at least one additional layer of polysilicon overlying the first polysilicon layer, the at least one additional layer of polysilicon being separated from the first polysilicon layer by a layer of conductive material formed therebetween, the thickness of the composite conductive layer being greater than about the following thickness for each 1 MeV incremental increase in implant energy $$(1.0 - 1.25) \times \sqrt{W_S/W_D} \text{ microns}$$

where $W_S$ is the atomic weight of silicon and $W_D$ is the atomic weight of the dopant atoms; and
 (c) forming a trench through each of the layers recited in steps (a) and (b) to expose a surface region of the silicon substrate.

* * * * *